(12) United States Patent
Kobayashi et al.

(10) Patent No.: US 6,245,311 B1
(45) Date of Patent: Jun. 12, 2001

(54) METHOD FOR HEAT TREATMENT OF SILICON WAFER AND SILICON WAFER

(75) Inventors: Norihiro Kobayashi; Shoji Akiyama, both of Gunma-ken; Toshihiko Miyano, Fukushima-ken, all of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/322,704

(22) Filed: May 28, 1999

(30) Foreign Application Priority Data

Jun. 9, 1998 (JP) .................................................. 10-176693

(51) Int. Cl.$^7$ .......................... C01B 33/00; C01B 33/021
(52) U.S. Cl. ........................... 423/348; 423/349; 423/350
(58) Field of Search ................................... 423/348, 349, 423/350

(56) References Cited

U.S. PATENT DOCUMENTS

| | | | |
|---|---|---|---|
| 5,403,406 | * | 4/1995 | Falster .................................. 148/33.2 |
| 6,017,819 | * | 1/2000 | Brighman .............................. 438/657 |

FOREIGN PATENT DOCUMENTS

| | | |
|---|---|---|
| 60-247935 | 12/1985 | (JP) . |
| 6-295912 | 10/1994 | (JP) . |
| 7-161707 | 6/1995 | (JP) . |
| 7-201874 | 8/1995 | (JP) . |
| 10-326790 | 12/1998 | (JP) . |
| WO 92 09101 | 5/1992 | (WO) . |

OTHER PUBLICATIONS

Maddalon–Vinante C. et al.; "Influence of rapid thermal annealing and internal gettering on Czochralski–grown silicon.I. oxygen precipitation"; Journal of applied Physics, U.S., American Institute of Physics, New York, vol. 79, No. 5, p. 2707–2711; Mar. 1, 1996.

Jacob M. et al.; "Influence of RTP on vacancy concentrations"; Semiconductor process and device performance modelling. Symposium, semiconductor process and device performance modelling. Symposium, Boston, MA, USA, Dec. 2–3, 1997, P. 129–134.

Yamakawa, et al. "Study of Interface roughness dependence of electron mobility in Si inversion layers using the Monte Carlo method." J. Appl. Phys. 79(2), Jan. 15, 1996, pp. 911–916.

Kunii, et al. "Removal of Si surface roughness by $H_2$ annealing." 27p–ZV–12, Extended Abstracts (1995), J. Soc. Appl. Phys., No. 2.

Ando, et al. "Spatially controlled formation of atomically flat surface on Si(001)." 27p–ZV–13, Extended Abstracts (1995), J. Soc. Appl. Phys., No. 2.

Ogino, et al. "Self–Organization of Nano–Structure in Small Holes on Si(111) Surfaces." 27p–ZV–14, Extended Abstracts (1995), J. Soc. Appl. Phys., No. 2.

* cited by examiner

Primary Examiner—Steven P. Griffin
Assistant Examiner—Maribel Medina
(74) Attorney, Agent, or Firm—Hogan & Hartson, LLP (57) ABSTRACT

There is disclosed a method for heat treatment of a silicon wafer performed in a reducing atmosphere containing hydrogen by utilizing a rapid thermal annealer, wherein the heat treatment comprises a plurality of steps each of which is performed with a differently defined heat treatment condition. In this method, the heat treatment comprising a plurality of steps may be continuously performed without taking out the wafer from an RTA apparatus. The method of the present invention can, in particular, reduce COP density of the silicon wafer surface, reduce its microroughness and haze, and thus improve electric characteristics such as oxide dielectric breakdown voltage and mobility of carriers.

19 Claims, 5 Drawing Sheets

FIG. 1

HEAT TREATMENT TEMPERATURE FOR FIRST STEP (°C)

FIG. 2

HEAT TREATMENT TEMPERATURE FOR FIRST STEP (°C)

HYDROGEN CONCENTRATION IN MIXED GAS (%)

FIG. 6

HEAT TREATMENT TEMPERATURE FOR SECOND STEP (°C)

FIG. 7

HEAT TREATMENT TIME FOR SECOND STEP (SECOND)

FIG. 8

HEAT TREATMENT TIME FOR SECOND STEP (SECOND)

FIG. 9

METHOD FOR HEAT TREATMENT OF SILICON WAFER AND SILICON WAFER

BACKGROUND OF THE INVENTION

1. Field of the Invention

The present invention relates to a method for heat treatment of a silicon wafer, and more particularly, it relates to a method for heat treatment of a silicon wafer that can reduce COP density, and at the same time, decrease microroughness and haze of the silicon wafer surface.

2. Description of the Related Art

In order to improve electric characteristics of silicon wafers such as oxide dielectric breakdown voltage, it is necessary to obtain a wafer surface layer on which devices are fabricated as a defect-free layer. In the surface layer of silicon wafer, there are usually crystal defects having a regular octahedral structure, which are introduced during the crystal growth. These defects are called COP (crystal originated particle), and may be a cause of the degradation of electric characteristics.

For improving the oxide dielectric breakdown voltage, it has been reported that it is effective to subject a silicon wafer to hydrogen annealing, i.e., a heat treatment at a high temperature under hydrogen gas atmosphere for several hours (for example, Japanese Patent Publication (KOKOKU) No. 5-18254, Japanese Patent Application Laid-open (KOKAI) No. 6-295912).

There has also been proposed a method for heat treatment utilizing an apparatus for rapid heating and rapid cooling (rapid thermal annealer, occasionally abbreviated as "RTA" apparatus hereinafter) for improvement of the heat treatment such as shortening of heat treatment time. For example, as disclosed in Japanese Patent Application Laid-open (KOKAI) No. 7-161707, there has been proposed a heat treatment within a relatively low temperature range of 950–1200° C. for a short period of time such as 1–60 seconds for improving the oxide dielectric breakdown voltage.

However, according to the aforementioned prior art method of Japanese Patent Application Laid-open (KOKAI) No. 7-161707, the condition for the heat treatment is defined in view of the oxide dielectric breakdown voltage, and COPs on the wafer surface, which directly affect on the electric characteristics of devices, are not considered at all, though BMD (bulk micro defect) density has been considered in the working examples thereof.

Further, the experiments conducted by the inventors of the present invention revealed that the heat treatment of the aforementioned prior art did not sufficiently improve COP, though it improved the oxide dielectric breakdown voltage to some extent. Therefore, the method did not afford sufficient improvements of electric characteristics except for the oxide dielectric breakdown voltage. That is, when a silicon wafer was subjected to a hydrogen heat treatment, for example, at 1050° C. for 30 seconds, which is within the range defined by the aforementioned prior art method, COPs might not be reduced, and on the contrary, the surface roughness, i.e., haze, might be degraded due to etching effect of hydrogen. Further, even when the heat treatment was performed at 1100° C., the reduction of COPs was still insufficient like the above case. That is, it was found that sufficient improvement of COP could not be obtained by the conditions of the heat treatment according to the prior art.

Therefore, the inventors of the present invention previously suggested a method for heat treatment of a silicon wafer in a reducing atmosphere utilizing an RTA apparatus in Japanese Patent Application No. 10-82606, which can specifically reduce COP density on the silicon wafer surface.

In this method, a silicon wafer is heat-treated at a temperature in the range of 1200° C. to the melting point of silicon in a reducing atmosphere for 1–60 seconds. It is described that the reducing atmosphere is preferably composed of 100% of hydrogen or a mixed atmosphere of hydrogen and argon, and the heat treatment time is preferably 1–30 seconds.

This method was found to be able to markedly reduce COP density on the silicon wafer surface, and also markedly improve the electric characteristics, i.e., the oxide dielectric breakdown voltage (time zero dielectric breakdown, TZDB) and the time dependent dielectric breakdown characteristic (TDDB).

On the other hand, with the recent use of higher integration degree of MOS structure transistors, it has become necessary to improve the mobility of carriers (electrons and holes) immediately under the oxide layer in the MOS structure. Further, with the use of increasingly higher driving frequency of CPU (central processing unit), higher writing and reading velocities of memories are of course required, and therefore improvement of the carrier mobility has become an important research subject.

Further, it has become clear that microroughness of wafer surface is closely related to performance and reliability of devices as factors greatly affecting the electric characteristics such as the oxide dielectric breakdown voltage and the mobility of carriers (see Shinya Yamakawa et. al., J. Appl. Phys. 79, 911, 1996).

As a method for reducing the microroughness of wafer surface, there has been known, for example, a method which comprises applying an electric current to the wafer surface using a special apparatus such as an ultra high vacuum apparatus (see Ando et al., Extended Abstracts (The 56th Autumn Meeting, 1995), The Japan Society of Applied Physics, 27p-ZV-13, 1995). However, it takes long time to obtain ultra high vacuum, and it also takes long time to return the vacuum to atmospheric pressure. This causes a problem that one must always pay attention to adhesion of particles during those process steps.

In addition, when the hydrogen annealing was performed within the temperature range of 1200° C. or more by using the aforementioned RTA apparatus, microroughness can only slightly be improved to an insufficient level, and the haze may be even degraded, whilst COP density is greatly reduced. Therefore, the hydrogen annealing condition must further be improved.

The term haze used herein refers an index of surface roughness, and represents periodic undulations having a length of several to several tens nm. This surface roughness can be evaluated quasi-quantitatively as a haze level of the whole wafer surface by scanning the whole surface of wafer with a laser beam, and determining its irregular refraction intensity by means of a particle counter, which mostly utilizes a laser.

To meet the future use of further miniaturized design rule, it is necessary to establish the conditions for heat treatment that can restore the degradation of the haze. In addition, if the haze value is increased, there may also be arisen a problem that LPDs (light point defects) of 0.10 $\mu$m or less cannot be measured when LPDs are determined by a particle counter, because the haze acts as background noise.

SUMMARY OF THE INVENTION

The present invention has been accomplished in view of the aforementioned problems, and the object of the present invention is to provide a method for heat treatment of a silicon wafer in a reducing atmosphere containing hydrogen by using an RTA apparatus, which method can, in particular, reduce COP density of the silicon wafer surface, as well as make its microroughness and haze further smaller, thereby improving the electric characteristics such as oxide dielectric breakdown voltage and mobility of carriers, and utilizing the advantages inherently possessed by the rapid thermal annealer such as improvements of yield and productivity, and reduction of the cost.

In order to achieve the aforementioned object, the present invention provides a method for heat treatment of a silicon wafer performed in a reducing atmosphere containing hydrogen by utilizing a rapid thermal annealer, characterized in that the heat treatment comprises a plurality of steps each of which is performed with a differently defined heat treatment condition.

In a method for heat treatment of a silicon wafer performed in a reducing atmosphere containing hydrogen by utilizing a rapid thermal annealer, if the heat treatment is performed with a plurality of steps each of which is performed with a differently defined heat treatment condition as described above, COPs can be markedly reduced and microroughness and haze can be decreased. Thus, silicon wafers exhibiting extremely few defects and excellent electric characteristics can be obtained.

In the aforementioned method, it is desirable that the heat treatment comprising a plurality of steps is continuously performed without taking out the wafer from the rapid thermal annealer.

By continuously performing the heat treatment comprising a plurality of steps as for the wafer set on the rapid thermal annealer as described above, COPs can more surely be eliminated compared with a case where the steps of the heat treatment are performed separately, and microroughness and haze can also be reduced. In addition, because the heat-treated wafer is not taken out from the apparatus for each step, temperature increase from and decrease to ambient temperature are not required. Therefore, time and thermal energy required for temperature increase and decrease can be saved, and thus improvement of productivity and cost reduction can be realized.

Further, in the aforementioned method, as for condition of the heat treatment comprising a plurality of steps, temperature for one step of the heat treatment is desirably selected so that it should be lower than that for the preceding step.

By selecting the temperature condition for the heat treatment as described above, one kind of quality obtained in the preceding step can be maintained without degrading it, and another kind of quality can be improved in the subsequent step. For example, COPs can be eliminated by a heat treatment at a higher temperature in the preceding step, and microroughness and haze can be newly reduced by a heat treatment at a lower temperature in the subsequent step while maintaining the elimination of COPs.

In the method of the present invention, among the plurality of steps of the heat treatment, for example, one step of the heat treatment may be performed at a temperature of 1200–1350° C. for 1–300 seconds, and another subsequent step may be performed at 900–1200° C. for 1–300 seconds.

With these heat treatment conditions, COPs can be surely eliminated by a heat treatment at a higher temperature range in the preceding step, and microroughness and haze can be newly and efficiently reduced to desired levels in an extremely short period of time at a lower temperature range in the subsequent step while maintaining the elimination of COPs.

The reducing atmosphere containing hydrogen is preferably composed of 100% of hydrogen, or a mixed gas atmosphere composed of hydrogen and argon and/or nitrogen.

Use of such a heat treatment atmosphere ensures the reduction of COP density, and improvement of microroughness and haze of the wafer surface.

The method for heat treatment of a silicon wafer according to the present invention can be performed before or during a semiconductor device-processing step. If the heat treatment is performed before a semiconductor device-processing step, devices excellent in electric characteristics such as oxide dielectric breakdown voltage and mobility of carriers can be produced relatively easily. In addition, the heat treatment can also be performed even during a semiconductor device-processing step as desired to improve electric characteristics, or restore degraded electric characteristics.

By the method for heat treatment of the present invention described above, COP density of the wafer surface is reduced, and microroughness and haze become small. Therefore, the electric characteristics such as oxide dielectric breakdown voltage and carrier mobility are improved, and silicon wafers of extremely high quality and usefulness can be obtained.

In particular, there can be obtained such a silicon wafer having the number of LPDs not less than. 0.12 $\mu$m (representing COP) of 0.064 LPD/cm$^2$ or less, determined by a particle counter, P-V value within a 2 $\mu$m square (area of 4 $\mu$m$^2$) (representing microroughness) of 1.0 nm or less, determined by an atomic force microscope, and scattered light intensity (representing haze level) of 0.3 ppm or less for incident light, determined by a particle counter.

According to the present invention, COP density of silicon wafer surface can be markedly reduced and its microroughness and haze can be made smaller by performing a heat treatment of the silicon wafer in a reducing atmosphere containing hydrogen with a plurality of steps by using a rapid thermal annealer. As a result, silicon wafers with excellent electric characteristics such as oxide dielectric breakdown voltage and mobility of carriers, and excellent crystallinity can be obtained, and improvements of yield and productivity, and reduction of the cost as for the silicon wafer production can be realized.

DESCRIPTION OF THE INVENTION AND EMBODIMENTS

The present invention and embodiments thereof will be explained more in detail hereinafter.

The inventors of the present invention investigated conditions for heat treatment which can reduce the density of COPs present on silicon wafer surface to improve the oxide dielectric breakdown voltage, and decrease microroughness and haze to realize improvements of electric characteristics such as improvement of carrier mobility through various experiments. As a result, they found that, if the heat treatment under the reducing atmosphere containing hydrogen gas is performed by a plurality of steps each of which is performed with a differently defined heat treatment condition, silicon wafers with low COP density and small microroughness and haze can be obtained. Further, they investigated various conditions for the aforementioned characteristics of the present invention, and thus completed the present invention.

First, in order to establish suitable heat treatment conditions for the plurality of steps for heat treatment of silicon wafers, which are set on a rapid thermal annealer, the following experiment was performed. As a heat treatment apparatus, an RTA apparatus (rapid thermal annealer, Steag Microtec International, SHS-2800) was used.

As silicon wafers, used were those having a diameter of 8 inches and crystal orientation of <100>, which had been obtained by slicing of a silicon ingot produced by the Czochralski method and mirror surface polishing in usual manners.

As for those silicon wafers, COP density of their surfaces was preliminarily measured before they were subjected to heat treatment, and it was confirmed that about 300 COPs/wafer were present on the surfaces. For the measurement of COPs, only particles of not less than 0.12 $\mu$m were detected by a particle counter (LS-6030, trade name of Hitachi Electronics Engineering), as commonly conducted.

The measurement of microroughness was performed for an area of 2 $\mu$m square by using AFM (atomic force microscope, NanoScope-II, trade name of Digital Instruments). The microroughness before heat treatment was 1.1 nm or more in terms of the P-V value (maximum difference between peaks and valleys).

The measurement of haze was performed by particle counters, LS-6030 (trade name of Hitachi Electronics Engineering) and SurfScan (SP-1, trade name of KLA Tencor).

Because these apparatuses had different space wavelengths, different surface areas were scanned. To confirm the decreasing tendency of haze, the measurement was performed by the both apparatuses. The space wavelengths of the these apparatuses were around 0.5–3 $\mu$m for LS-6030, and 2–5 $\mu$m for SP-1.

Figure 1:
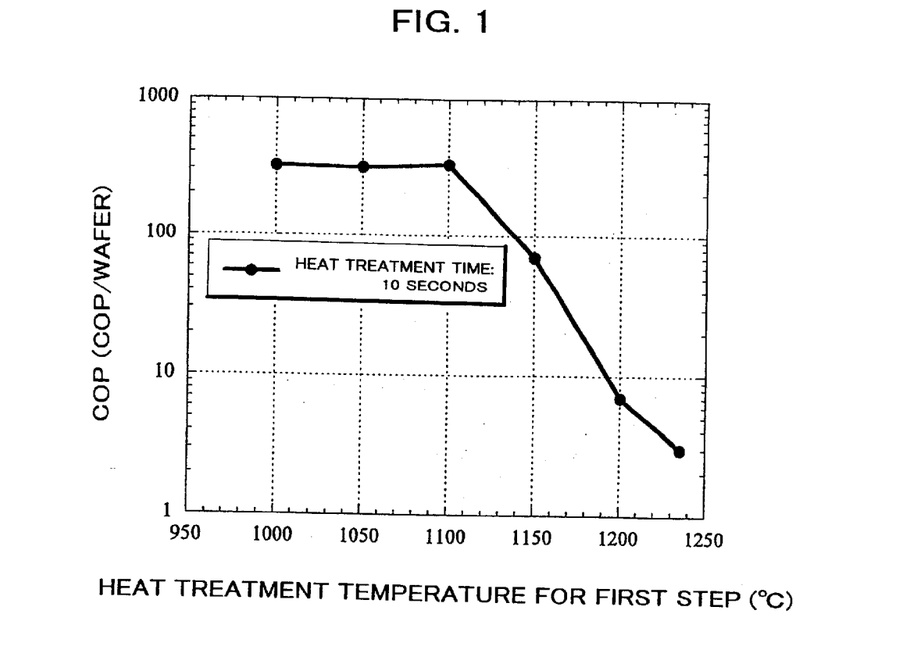
FIG. 1 is a graph representing the relationship between heat treatment temperature of the first step and COP density after the heat treatment in the heat treatment comprising a plurality of steps by a rapid thermal annealer.

The heat treatment was performed by two steps, and the first step was performed in a range of 1000–1230° C. to eliminate COPs. The reducing atmosphere containing hydrogen was composed of 100% of hydrogen gas, and the heat treatment was performed for a constant heat treatment time of ten seconds. The results are shown in FIG. 1. From this figure, it can be seen that the density of COPs on the wafer surfaces began to decrease at 1150° C., and became about 10 or less COPs/8-inch wafer at a temperature of 1200° C. or higher. As a pretreatment of wafers, native oxide was removed by hydrofluoric acid (HF) in this experiment, but elimination of COPs represented the same tendency also for those wafers not subjected to such a treatment.

Figure 2:
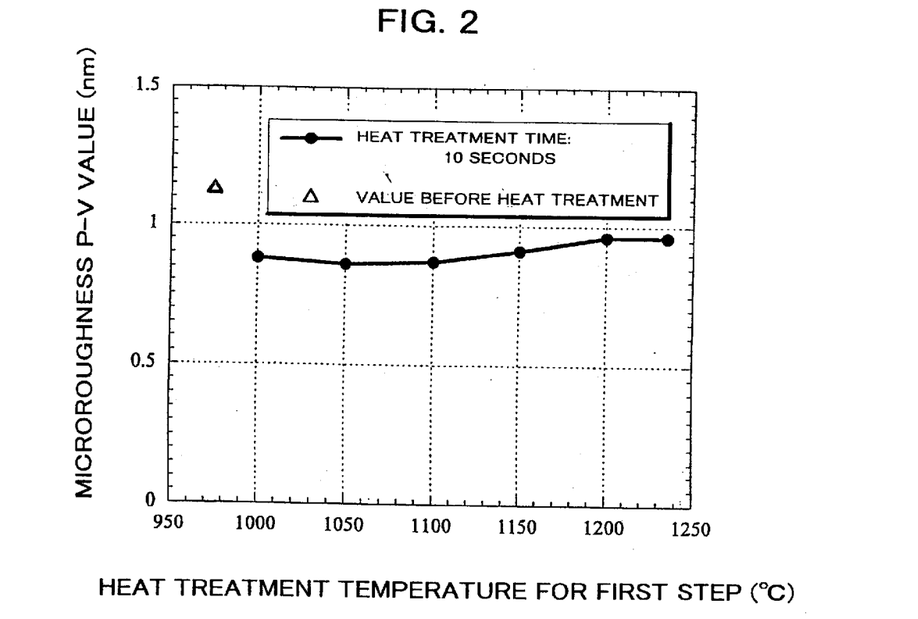
FIG. 2 is a graph representing the relationship between heat treatment temperature of the first step and microroughness after the heat treatment in the heat treatment comprising a plurality of steps by a rapid thermal annealer.

As shown in FIG. 2, microroughness was improved from 1.1 nm to 0.9 nm on average in terms of the P-V value in the aforementioned temperature range. Haze was not substantially changed in the first step of the heat treatment.

The second step of the heat treatment aimed at the reduction of microroughness and haze. First, reduction of microroughness was investigated. This step was performed in a temperature range of 1000–1150° C. for ten seconds under an atmosphere of 100% of hydrogen gas. Temperature decreasing operation for shifting from the first step to the second step was performed by descending a stage on which a wafer was placed to a low temperature region with a temperature decreasing rate of 33° C./second, and the shift was performed within several seconds.

Figure 3:
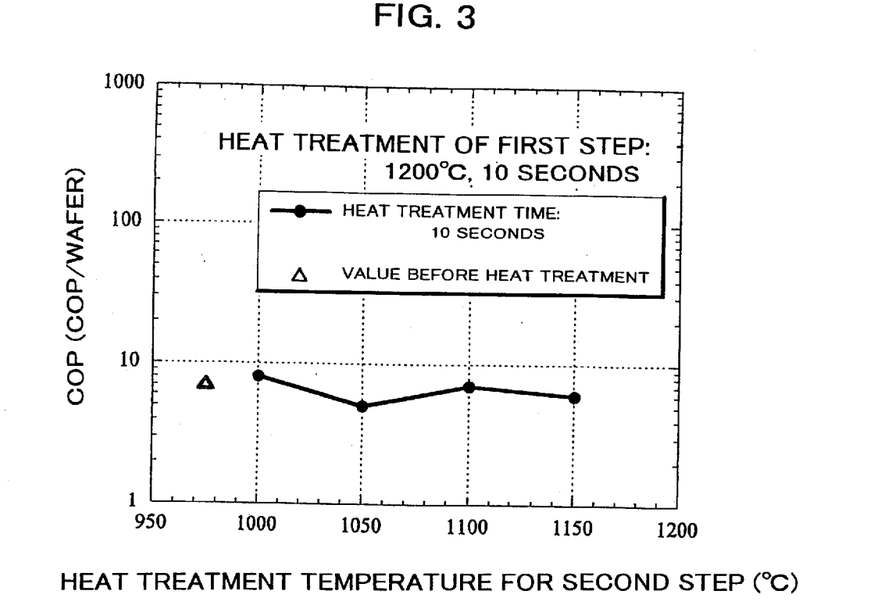
FIG. 3 is a graph representing the relationship between heat treatment temperature of the second step and COP density after the heat treatment in the heat treatment comprising a plurality of steps by a rapid thermal annealer.

The results of the second step of the heat treatment are shown in FIG. 3. From this figure, it can be seen that elimination of COPs was not substantially affected by the second step of the heat treatment, and it was established by the first step of the heat treatment. In other words, if the heat treatment of the first step is performed at a temperature of not less than 1200° C., the density of COPs does not change with any temperature condition of the heat treatment of the second step. A smaller density of COPs is more preferred, and when the COP density was made about 10 COPs or less per 8-inch wafer according to the present invention, the electric characteristics such as TZDB and TDDB were markedly improved. Thus, according to the present invention, wafers with a COP density of 20 COPs/8-inch wafer (0.064 COP/cm$^2$) or less can be surely and stably produced.

Figure 4:
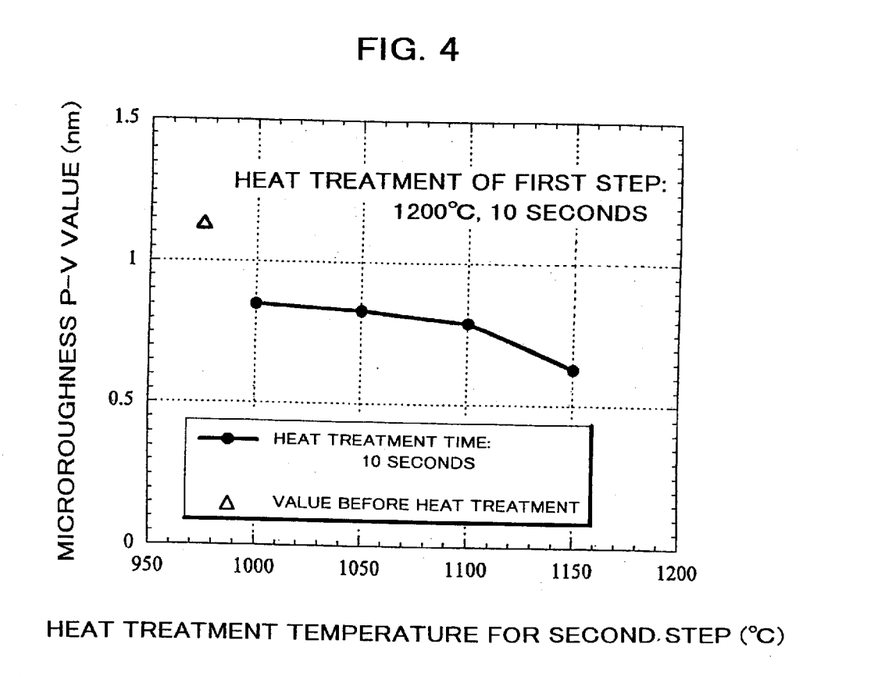
FIG. 4 is a graph representing the relationship between heat treatment temperature of the second step and microroughness after the heat treatment in the heat treatment comprising a plurality of steps by a rapid thermal annealer.

As shown in FIG. 4, it can be seen that microroughness was more improved from 1.1 nm before the heat treatment to 0.85–0.6 nm in terms of the P-V value as the temperature became higher by the second step of the heat treatment.

Then, haze was investigated. First, effect of hydrogen concentration in the reducing atmosphere containing hydrogen was examined. The second step of the heat treatment was performed at 1050° C. for 60 seconds by using a mixed gas with varying hydrogen gas concentration of 30–80% (remainder gas was composed of nitrogen and argon). Haze (bit number) was measured by the particle counter LS-6030.

Figure 5:
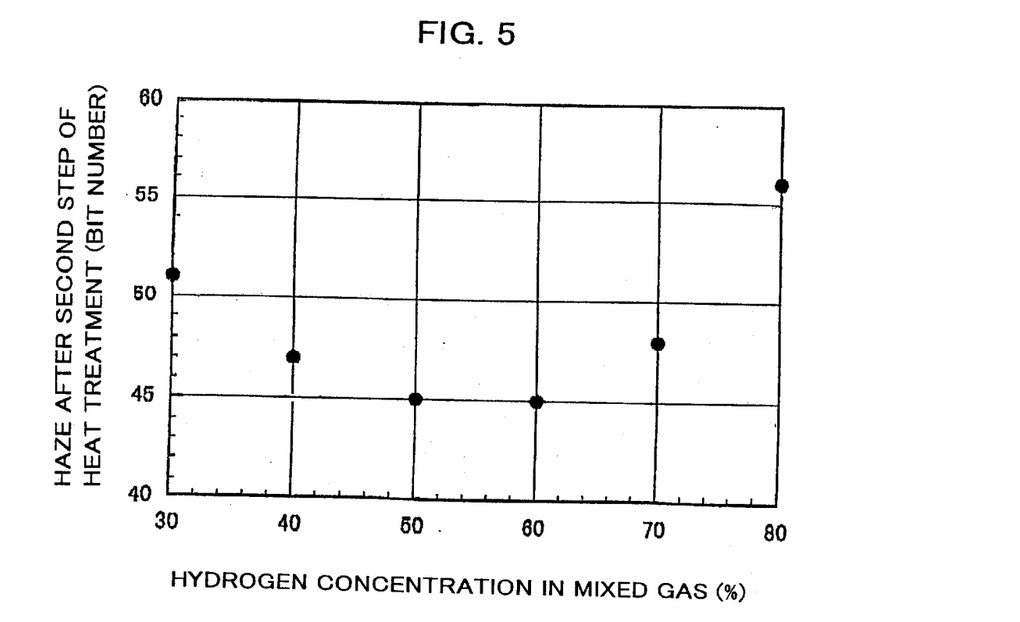
FIG. 5 is a graph representing the relationship between hydrogen concentration in mixed gas for the heat treatment of the second step by a rapid thermal annealer and haze after the heat treatment.

The results are shown in FIG. 5. It can be understood from the figure that 40–70% of the hydrogen concentration is suitable.

Figure 6:
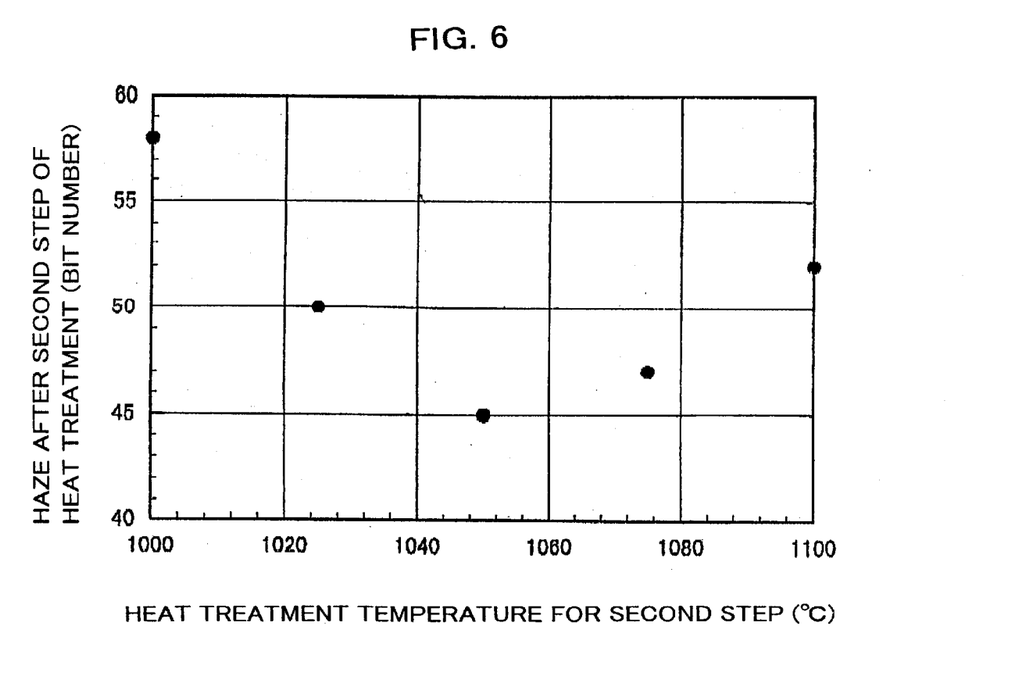
FIG. 6 is a graph representing the relationship between heat treatment temperature for the heat treatment of the second step by a rapid thermal annealer and haze after the heat treatment.

The results of the second step of the heat treatment as for haze are shown in FIG. 6. FIG. 6 shows the relationship between the temperature of the second step of the heat treatment and haze (bit number) after the heat treatment. The experiment was performed by using an atmospheric gas composed of 60% of hydrogen, 20% of argon, and 20% of nitrogen within the temperature range of 1000–1100° C. As a result, it was found that suitable temperature was around 1050° C.

Figure 7:
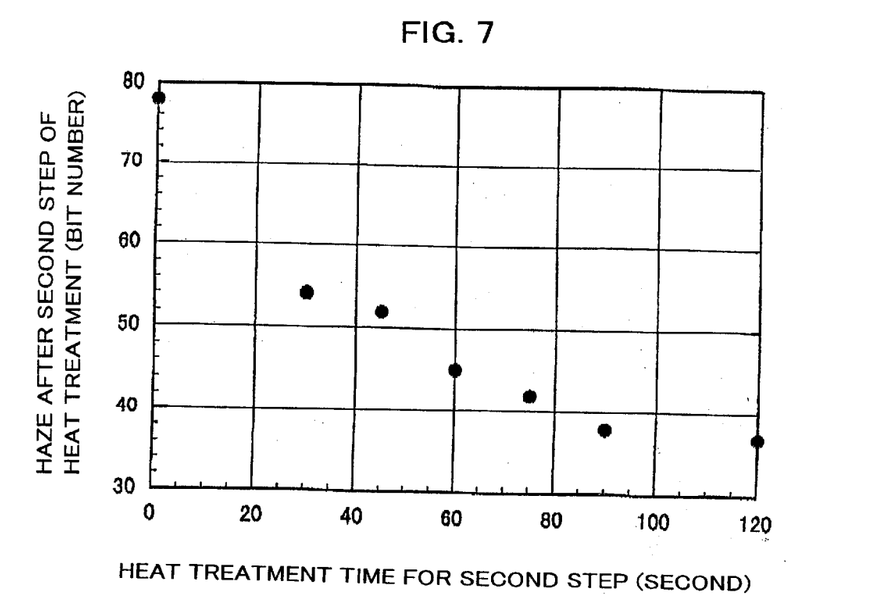
FIG. 7 is a graph representing the relationship between heat treatment time for the heat treatment of the second step by a rapid thermal annealer and haze (bit number) after the heat treatment.
Figure 8:
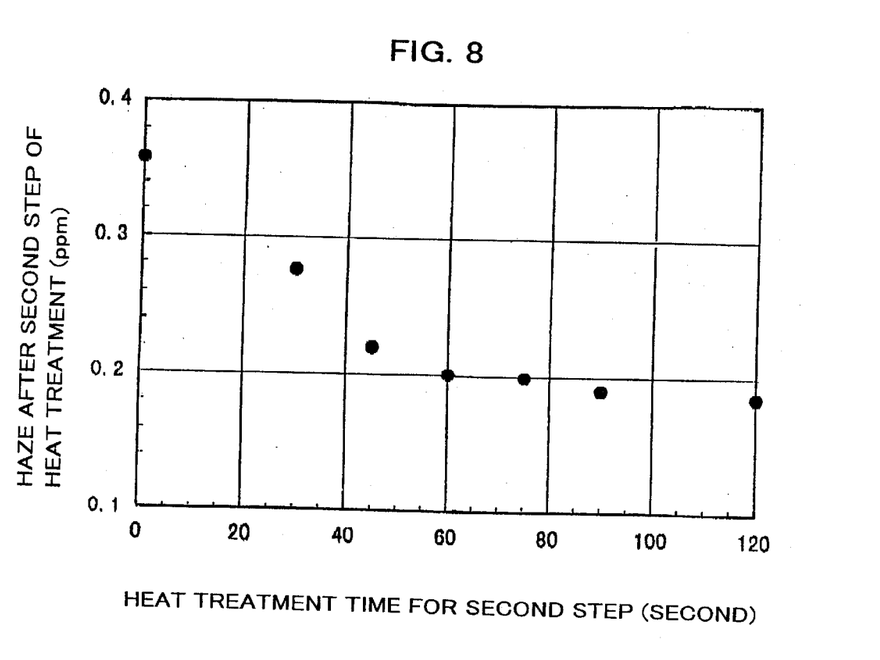
FIG. 8 is a graph representing the relationship between heat treatment time for the heat treatment of the second step by a rapid thermal annealer and haze (ppm) after the heat treatment.

As for the treatment time, it can be understood that haze was markedly improved with a treatment time of 20–120 seconds as shown in FIGS. 7 and 8, when the experiment was performed at a heat treatment temperature of 1050° C. with an atmospheric gas composed of 60% of hydrogen, 20% of argon, and 20% of nitrogen with varying the treatment time from 0 to 120 seconds. FIG. 7 shows values (bit number) measured by the particle counter LS-6030, and FIG. 8 shows the values (ppm) measured by SP-1. The improvement of haze is supported by the results obtained by the both apparatuses.

Because these apparatuses for measuring the haze level scanned different surface areas, and employed different detection mechanisms, they could not provide the evaluation in terms of the same parameter. When the measurement was performed by the particle counter SP-1 having a space wavelength of about 2–5 $\mu$m, the wafers of the present invention showed scattered light intensity of 0.3 ppm or less for incident light (this represents haze) as shown in FIG. 8. When the measurement was performed by the particle counter LS-6030 having a space wavelength of 0.5–3 $\mu$m (FIG. 7), the same wafers afforded the results of about 60 bits.

As a summary of the foregoing experiments and investigations, it can be concluded that, when silicon wafers are subjected in single wafer processing to a heat treatment comprising a plurality of steps performed in a reducing atmosphere containing hydrogen by using an RTA apparatus, by employing a heat treatment temperature in the range of 1150–1250° C. and a treatment time of ten seconds for the first step of the heat treatment, and a heat treatment temperature of 1000–1150° C. and a treatment time of 10–120 seconds for the second step of the heat treatment, density of COPs decreases to around 10% to 1% of that observed before the heat treatment, microroughness is reduced to around 80% to 55% of that observed before the heat treatment, and haze level also decreases to around 80–50% of that observed before the heat treatment, and thus there can be obtained silicon wafers exhibiting practically sufficient levels of these parameters.

Embodiments of the present invention will be explained hereinafter with reference to the appended drawing, but the scope of the present invention is not limited to them.

Figure 9:
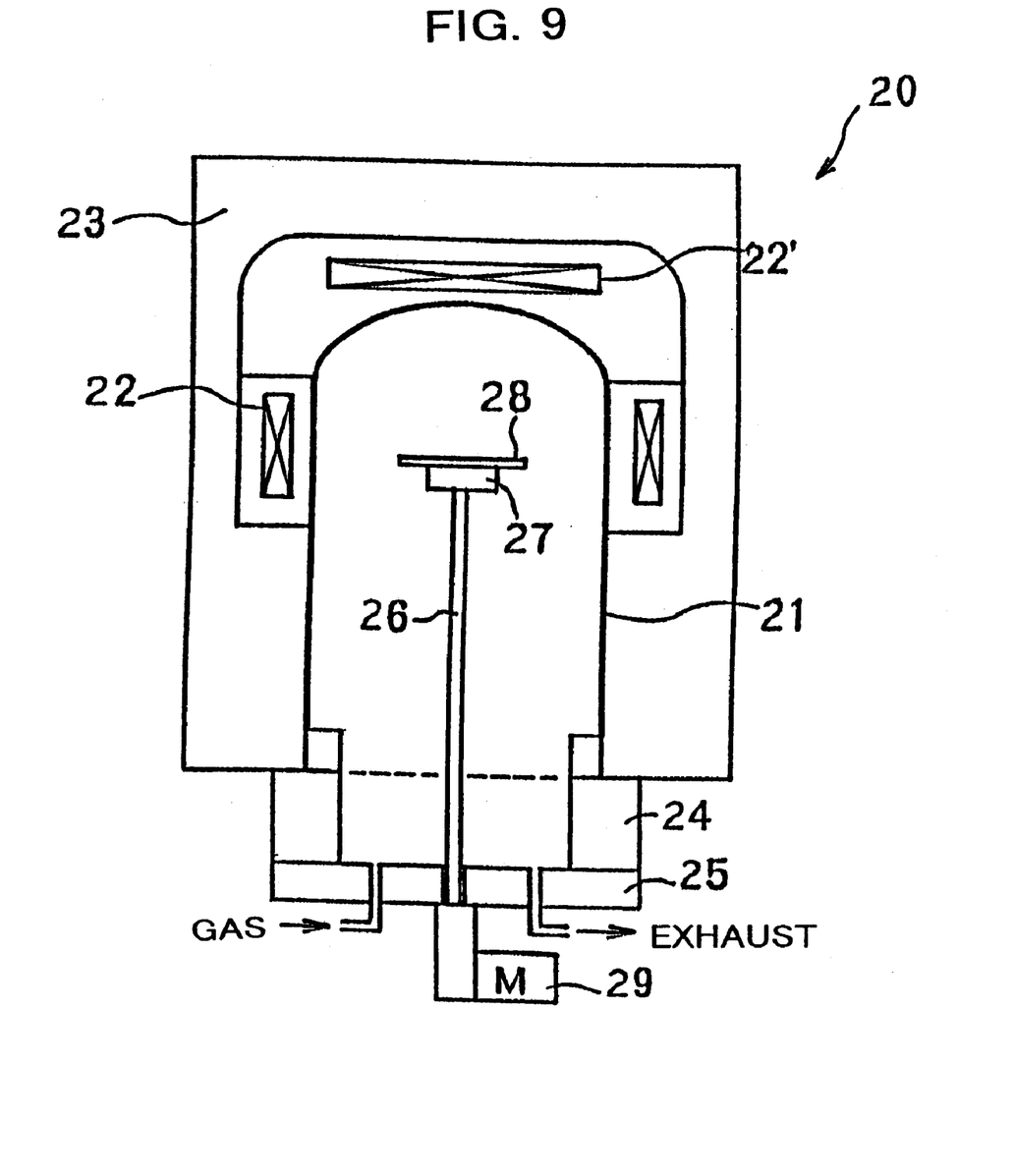
FIG. 9 is a schematic cross-sectional view of an apparatus capable of rapid heating and rapid cooling of a silicon wafer.

An exemplary apparatus that can perform rapidly heating and rapidly cooling a silicon wafer in a reducing atmosphere containing hydrogen, which can be used for the invention, will be explained hereinafter. FIG. 9 is a schematic cross-sectional view of such an apparatus capable of rapid heating and rapid cooling.

A heat treatment apparatus 20 shown in FIG. 9 comprises a bell jar 21 composed of, for example, silicon carbide or quartz, and silicon wafers are heat-treated in this bell jar 21. Heating is performed by heaters 22 and 22', which are disposed so that they should surround the bell jar 21. These heaters are divided into a top part and a lateral part, and electric power supplied to them can be independently controlled. A housing 23 for shielding heat is disposed outside the heaters 22 and 22'. Of course, the heat treatment apparatus and heating method are not limited to these, and the so-called radiation heating, high-frequency heating and the like may also be used.

A water cooled chamber 24 and a base plate 25 are disposed under a furnace, and they shut the inside of the bell jar 21 off from the outer air. A silicon wafer 28 is held on a stage 27, and the stage 27 is fixed at the top of supporting shaft 26 which can be freely moved upward and downward by a motor 29. The water cooled chamber 24 has a wafer insertion port (not shown in the figure) which can be opened and closed by a gate valve, so that the wafer can be put into and taken out from the furnace along the transverse direction. The base plate 25 is provided with a gas inlet and exhaust outlet, so that the gaseous atmosphere in the furnace can be controlled.

By using such a heat treatment apparatus 20 as mentioned above, the heat treatment of a silicon wafer for rapid heating and rapid cooling in a reducing atmosphere containing hydrogen, which comprises a plurality of steps, for example, two-step heat treatment (first step: high temperature heat treatment, second step: low temperature heat treatment), is performed as follows.

First, in the high temperature heat treatment of the first step, the inside of the bell jar 21 is heated to a desired temperature, for example, 1200–1350° C., by the heaters 22 and 22', and maintained at that temperature. By independently controlling the electric power supplied to each of the separate heaters, temperature gradient can be obtained in the bell jar 21 along its height direction. Therefore, at this point, a region at a temperature of 900–1200° C., which is desired for the low temperature heat treatment of the second step, can be obtained under the region for the high temperature heat treatment of the first step. Thus, even when the heat treatment temperature for a wafer is different in the plurality of steps, it can be selected by changing the position of the stage 27, i.e., the length of the supporting shaft 26 inserted into the furnace.

After the inside of the bell jar 21 reached and maintained at a desired temperature, a silicon wafer is inserted from the insertion port of the water cooled chamber 24 by a wafer handling apparatus not shown in the figure, which is disposed at a neighboring position of the heat treatment apparatus 20, and placed on the stage 27 waiting at its lowest position via, for example, a SiC boat. At this point, because the water cooled chamber 24 and the base plate 25 are cooled with water, the wafer is not heated to a high temperature.

After the silicon wafer was placed on the stage 27, the stage 27 is immediately elevated to a position of desired temperature at 1200° C. to 1350° C. by inserting the supporting shaft 26 into the inside of the furnace by the motor 29 so that the wafer on the stage should be subjected to the high temperature heat treatment. In this operation, because the stage moves from its lowest position in the water cooled chamber 24 to the desired temperature position within, for example, only 20 seconds, the wafer will be rapidly heated.

Then, by maintaining the stage 27 at the desired temperature position for a predetermined period of time (1–300 seconds), the wafer can be subjected to the high temperature heat treatment in the reducing atmosphere containing hydrogen for the period of time for which the wafer was maintained at the position. When the predetermined time has passed and the high temperature heat treatment of the first step was finished, the supporting shaft 26 is immediately lowered by the motor 29, so that the stage 27 should be lowered to a preliminarily provided region at a temperature of 900–1200° C., which is the heat treatment temperature of the second step, within several seconds. Then, by maintaining the stage at the desired temperature position for a predetermined time (1–300 seconds), the wafer can be subjected to low temperature heat treatment in the reducing atmosphere containing hydrogen for the period of time for which the wafer was maintained at the position.

When the predetermined time has passed and the low temperature heat treatment of the second step is finished, the stage 27 is immediately descended by pulling the supporting shaft 26 out from the furnace by the motor 29, and positioned at the bottom of the water cooled chamber 24. This descending operation can also be performed within, for example, about 20 seconds. Because the water cooled chamber 24 and the base plate 25 are cooled with water, the silicon wafer on the stage 27 is cooled rapidly. Finally, the silicon wafer is taken out by the wafer handling apparatus to finish the two-step continuous heat treatment.

When additional silicon wafers are to be heat-treated, those silicon wafers can be introduced successively into the apparatus and subjected to the heat treatment comprising a plurality of steps, since the temperature in the heat treatment apparatus 20 is not lowered.

While the heat treatment comprising a plurality of steps has been explained by exemplifying a two-step heat treatment in the foregoing description, the heat treatment for rapid heating and rapid cooling utilizing a rapid thermal annealer (RTA apparatus) according to the present invention may be one comprising placing a wafer at a predetermined position in a heat treatment furnace and immediately performing heat treatment with a lamp heater or the like, in addition to the aforementioned one comprising immediately introducing a wafer into a heat treatment furnace adjusted to the aforementioned temperature range, and immediately taking out it after the aforementioned heat treatment time has passed. The expressions of "immediately introducing" and "immediately taking out" mean that the heat treatment is performed without the so-called loading and unloading operations, i.e., without temperature elevating and decreasing operations within predetermined periods of time, or slow introduction and taking out of a wafer into and from a heat treatment furnace as conventionally performed. However, it, of course, takes a certain period of time to move the wafer to a predetermined position in the furnace, and therefore the aforementioned expression means that the operations are performed within several seconds to several minutes depending on the performance of the apparatus for introducing the wafer.

The method for heat treatment of a silicon wafer performed in a reducing atmosphere containing hydrogen by utilizing a rapid thermal annealer according to the present invention is characterized in that the heat treatment is performed by a plurality of steps, and heat treatment condition is differently defined for each step.

In a method for heat treatment of a silicon wafer performed in a reducing atmosphere containing hydrogen by utilizing a rapid thermal annealer, if the heat treatment is performed with a plurality of steps each of which is performed with a differently defined heat treatment condition as described above, COPs can be markedly reduced and microroughness and haze can be decreased. Thus, silicon wafers exhibiting extremely few defects and excellent electric characteristics such as oxide dielectric breakdown voltage and carrier mobility can be obtained.

In the aforementioned method, it is desirable that the heat treatment comprising a plurality of steps is continuously performed without taking out the wafer from the RTA apparatus.

When the heat treatment comprising the plurality of steps is continuously performed as for the wafer set on the RTA apparatus as described above, COPs can be m ore surely eliminated compared with a case where the steps of the heat treatment are performed separately, and thus microroughness and haze can simultaneously be reduced. In addition, because the heat-treated wafer is not taken out from the RTA apparatus for each step, temperature increase and decrease from and to ambient temperature are not required. Therefore, time and thermal energy required for temperature increase and decrease can be saved, and thus improvements of productivity and yield, and cost reduction can be realized.

Further, in the aforementioned method, as for condition of the heat treatment comprising a plurality of steps, temperature for one step of the heat treatment is desirably selected so that it should be lower than that for the preceding step.

By selecting the temperature condition for the heat treatment as described above, one kind of good quality obtained in the preceding step can be maintained without degrading it, and another kind of quality can be improved in the subsequent step. For example, density of COPs can be reduced or COPs can be eliminated by a heat treatment at a higher temperature in the preceding step, and microroughness and haze can be newly reduced in a subsequent step at a lower temperature while maintaining the state of the COP.

Further, it has been found that, according to this method, when the high temperature heat treatment of the preceding step is applied to a wafer free from COP, haze is further improved compared with the case where the wafer is subjected only to the low temperature heat treatment of the subsequent step. Therefore, the method can be used for silicon layers of wafers free from COP (perfect crystals, quasi-perfect crystals, epitaxial wafers) and SOI wafers aiming at the improvement of haze.

As more specific heat treatment conditions according to the present invention, among the plurality of steps of the heat treatment, one preceding step of the heat treatment may be performed at 1200–1350° C. for 1–300 seconds, and another subsequent step may be performed at 900–1200° C. for 1–300 seconds.

By these heat treatment conditions, density of COPs can surely be reduced or eliminated by the heat treatment at a higher temperature range in the preceding step, and microroughness and haze can be newly and efficiently reduced in an extremely short period of time in the subsequent step at a lower temperature range while maintaining the state of COP.

When the temperature of the heat treatment of the preceding step exceeds 1350° C., problems concerning durability of furnace, contamination of wafers and the like may be caused. Therefore, it is preferably performed at a temperature of 1200–1350° C.

The aforementioned reducing heat treatment atmosphere containing hydrogen may be composed of 100% of hydrogen, or a mixed gas atmosphere composed of hydrogen and argon and/or nitrogen may be used as the atmosphere to control the reducing ability of hydrogen or for the reason of safety.

Use of such a heat-treatment atmosphere ensures the reduction of COP density of the wafer surface, and improvements of microroughness and haze. In particular, a hydrogen concentration of around 40–70% in the mixed gas is preferred for reducing haze.

The method for heat treatment of a silicon wafer according to the present invention can be performed before or during a semiconductor device-processing step. If the heat treatment is performed before a semiconductor device-processing step, devices excellent in electric characteristics such as oxide dielectric breakdown voltage and mobility of carriers can be produced relatively easily because wafers of improved quality can be used for the device fabricating. The heat treatment according to the present invention can also be performed even during a semiconductor device-processing step as desired to improve electric characteristics, or restore degraded electric characteristics.

By the method for heat treatment of the present invention described above, COP density of the wafer surface is reduced, and its microroughness and haze are made small. Therefore, electric characteristics such as oxide dielectric breakdown voltage and carrier mobility are improved, and silicon wafers of extremely high quality and usefulness as those for semiconductor devices can be obtained with high yield and high productivity.

In particular, there can be obtained such a silicon wafer having the number of LPDs not less than 0.12 $\mu$m (representing COP) of 20 COPs/8-inch wafer (0.064 LPD/cm$^2$ or less), determined by a particle counter, P-V value within a 2 $\mu$m square (area of 4 $\mu$m$^2$) (representing microroughness) of 1.0 nm or less, determined by an atomic force microscope, and scattered light intensity (representing haze level) of 0.3 ppm or less for incident light, determined by a particle counter.

The present invention is not limited to the embodiments described above. The above-described embodiments are mere examples, and those having the substantially same structure as that described in the appended claims and providing the similar functions and advantages are included in the scope of the present invention.

For example, while the aforementioned embodiments utilizes such a heat treatment apparatus as shown in FIG. 9, the method of the present invention need not necessarily be performed with such an apparatus, and it can be performed in principle with any apparatus so long as it is an apparatus capable of rapid heating and rapid cooling of silicon wafers, and it can realize the heating to 900° C. or higher and the heat treatment comprising a plurality of steps.

Further, the aforementioned embodiments have been explained for the heat treatment of silicon wafers having a diameter of 8 inches, but the present invention can be used irrespective of the wafer diameter in principle, and used for silicon wafers having a diameter of, for example, 10 to 16 inches or more.

Furthermore, the method for heat treatment of the present invention can also be used for restoring surface roughness of epitaxial wafers and SOI layers of SOI wafers (reduction of haze), and the production of wafers for particle monitoring adapted to a particle size of 0.09 $\mu$m.

What is claimed is:

1. A method for heat treatment of a silicon wafer, wherein the heat treatment comprises a plurality of steps each of which is performed in a manner of rapid thermal annealing with a differently defined heat treatment condition in a reducing atmosphere containing hydrogen by utilizing a rapid thermal annealer.

2. The method for heat treatment of a silicon wafer according to claim 1, wherein the heat treatment comprising a plurality of steps is continuously performed without taking out the wafer from the rapid thermal annealer.

3. The method for heat treatment of a silicon wafer according to claim 1, wherein, as for condition of the heat treatment comprising a plurality of steps, temperature for one step of the heat treatment is selected so that it should be lower than that for the preceding step.

4. The method for heat treatment of a silicon wafer according to claim 2, wherein, as for condition of the heat treatment comprising a plurality of steps, temperature for one step of the heat treatment is selected so that it should be lower than that for the preceding step.

5. The method for heat treatment of a silicon wafer according to claim 1, wherein, among the plurality of steps of the heat treatment, one step of the heat treatment is performed at a temperature of 1200–1350° C. for 1–300 seconds, and another subsequent step is performed at 900–1200° C. for 1–300 seconds.

6. The method for heat treatment of a silicon wafer according to claim 2, wherein, among the plurality of steps of the heat treatment, one step of the heat treatment is performed at a temperature of 1200–1350° C. for 1–300 seconds, and another subsequent step is performed at 900–1200° C. for 1–300 seconds.

7. The method for heat treatment of a silicon wafer according to claim 3, wherein, among the plurality of steps of the heat treatment, one step of the heat treatment is performed at a temperature of 1200–1350° C. for 1–300 seconds, and another subsequent step is performed at 900–1200° C. for 1–300 seconds.

8. The method for heat treatment of a silicon wafer according to claim 4, wherein, among the plurality of steps of the heat treatment, one step of the heat treatment is performed at a temperature of 1200–1350° C. for 1–300 seconds, and another subsequent step is performed at 900–1200° C. for 1–300 seconds.

9. The method for heat treatment of a silicon wafer according to claim 1, wherein the reducing atmosphere containing hydrogen is composed of 100% of hydrogen, or a mixed gas atmosphere composed of hydrogen and argon and/or nitrogen.

10. The method for heat treatment of a silicon wafer according to claim 2, wherein the reducing atmosphere containing hydrogen is composed of 100% of hydrogen, or a mixed gas atmosphere composed of hydrogen and argon and/or nitrogen.

11. The method for heat treatment of a silicon wafer according to claim 3, wherein the reducing atmosphere containing hydrogen is composed of 100% of hydrogen, or a mixed gas atmosphere composed of hydrogen and argon and/or nitrogen.

12. The method for heat treatment of a silicon wafer according to claim 4, wherein the reducing atmosphere containing hydrogen is composed of 100% of hydrogen, or a mixed gas atmosphere composed of hydrogen and argon and/or nitrogen.

13. The method for heat treatment of a silicon wafer according to claim 5, wherein the reducing atmosphere containing hydrogen is composed of 100% of hydrogen, or a mixed gas atmosphere composed of hydrogen and argon and/or nitrogen.

14. The method for heat treatment of a silicon wafer according to claim 6, wherein the reducing atmosphere containing hydrogen is composed of 100% of hydrogen, or a mixed gas atmosphere composed of hydrogen and argon and/or nitrogen.

15. The method for heat treatment of a silicon wafer according to claim 7, wherein the reducing atmosphere containing hydrogen is composed of 100% of hydrogen, or a mixed gas atmosphere composed of hydrogen and argon and/or nitrogen.

16. The method for heat treatment of a silicon wafer according to claim 8, wherein the reducing atmosphere containing hydrogen is composed of 100% of hydrogen, or a mixed gas atmosphere composed of hydrogen and argon and/or nitrogen.

17. The method for heat treatment of a silicon wafer according to claim 1, wherein the method is performed before or during a semiconductor device-processing step.

18. A silicon wafer which has been heat-treated by a method for heat treatment of a silicon wafer according to claim 1.

19. A silicon wafer wherein the number of LPD not less than 0.12 µm determined by a particle counter is 0.064 LPD/$cm^2$ or less, the P-V value within a 2 µm square is 1.0 nm or less, determined by an atomic force microscope, and the scattered light intensity is 0.3 ppm or less for incident light, determined by a particle counter.

* * * * *